United States Patent
Shigeta et al.

(10) Patent No.: US 11,159,160 B2
(45) Date of Patent: Oct. 26, 2021

(54) AC SWITCH, AND UNINTERRUPTIBLE POWER SUPPLY AND VOLTAGE SAG COMPENSATOR INCLUDING AC SWITCH

(71) Applicant: TOSHIBA MITSUBISHI-ELECTRIC INDUSTRIAL SYSTEMS CORPORATION, Chuo-ku (JP)

(72) Inventors: Hiroki Shigeta, Chuo-ku (JP); Toshihide Nakano, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 16/633,232

(22) PCT Filed: Jul. 27, 2017

(86) PCT No.: PCT/JP2017/027211
§ 371 (c)(1),
(2) Date: Jan. 23, 2020

(87) PCT Pub. No.: WO2019/021416
PCT Pub. Date: Jan. 31, 2019

(65) Prior Publication Data
US 2020/0186147 A1    Jun. 11, 2020

(51) Int. Cl.
*H03K 17/00*    (2006.01)
*H03K 17/725*    (2006.01)
(Continued)

(52) U.S. Cl.
CPC ....... *H03K 17/725* (2013.01); *G01R 19/1659* (2013.01); *H02J 9/062* (2013.01);
(Continued)

(58) Field of Classification Search
None
See application file for complete search history.

(56) References Cited

U.S. PATENT DOCUMENTS 5,004,957 A * 4/1991 Cunningham ......... H05B 39/08
                                                    315/199
5,153,489 A * 10/1992 Unsworth ............... H02P 27/02
                                                    318/490
(Continued)

FOREIGN PATENT DOCUMENTS

JP     58-21925 A     2/1983
JP     6-283360 A    10/1994
(Continued)

OTHER PUBLICATIONS

Office Action dated Oct. 26, 2020 in corresponding Indian Patent Application No. 202017007000 (with English Translation), 6 pages.
(Continued)

*Primary Examiner* — Tuan T Lam
(74) *Attorney, Agent, or Firm* — Oblon, McClelland, Maier & Neustadt, L.L.P.

(57) ABSTRACT

An AC switch (1) includes a first thyristor (T1), a second thyristor (T2), a third thyristor (T3), and a fourth thyristor (T4). The first thyristor (T1) has an anode connected to an AC power source (2), and a cathode connected to a load (3). The second thyristor (T2) is connected in antiparallel to the first thyristor (T1). The third thyristor (T3) has an anode connected to the AC power source (2), and a cathode connected to the load (3). The fourth thyristor (T4) is connected in antiparallel to the third thyristor (T3). A current detector (5) detects the AC current supplied from the AC power source (2) to the load (3). A controller (6) causes the first thyristor (T1) and the third thyristor (T3) to conduct alternately and causes the second thyristor (T2) and the fourth thyristor (T4) to conduct alternately, for each one-cycle period of the AC current, in accordance with the detection value from the current detector (5).

4 Claims, 11 Drawing Sheets

(51) Int. Cl.
*H02J 9/06* (2006.01)
*G01R 19/165* (2006.01)
*H02M 5/458* (2006.01)
*H03K 17/12* (2006.01)

(52) U.S. Cl.
CPC ............ *H02J 9/068* (2020.01); *H02M 5/458* (2013.01); *H03K 17/125* (2013.01); *H03K 2217/0009* (2013.01)

(56) References Cited

U.S. PATENT DOCUMENTS

| | | | | |
|---|---|---|---|---|
| 5,461,300 | A * | 10/1995 | Kappenman | G05F 5/00 323/215 |
| 6,256,211 | B1 * | 7/2001 | Milazzotto | H02M 5/293 363/39 |
| 9,621,099 | B1 * | 4/2017 | Namuduri | H02P 25/18 |
| 2002/0195879 | A1 * | 12/2002 | Okui | H02J 9/062 307/64 |
| 2009/0230919 | A1 * | 9/2009 | Nethken | H02J 7/0027 320/115 |
| 2011/0109297 | A1 * | 5/2011 | Tosuntikool | H03K 17/125 323/350 |
| 2013/0020869 | A1 * | 1/2013 | Wallmeier | H02M 5/16 307/18 |
| 2014/0312814 | A1 * | 10/2014 | Benecke | H02P 6/34 318/400.03 |
| 2014/0312826 | A1 * | 10/2014 | Benecke | H02P 25/024 318/723 |
| 2017/0353179 | A1 * | 12/2017 | Matsumoto | H03K 17/725 |
| 2021/0036698 | A1 * | 2/2021 | Nakano | H03K 17/18 |

FOREIGN PATENT DOCUMENTS

| | | |
|---|---|---|
| JP | 2005-192354 A | 7/2005 |
| JP | 2008-99468 A | 4/2008 |
| JP | 2013-24682 A | 2/2013 |
| WO | 2017/094179 A1 | 6/2017 |

OTHER PUBLICATIONS

International Search Report dated Oct. 17, 2017 in PCT/JP2017/027211 filed Jul. 27, 2017.

Notification of Reason for Refusal dated Aug. 12, 2021 issued in corresponding Korean patent application No. KR 10-2020-7004656 (with machine translation).

* cited by examiner

AC SWITCH, AND UNINTERRUPTIBLE POWER SUPPLY AND VOLTAGE SAG COMPENSATOR INCLUDING AC SWITCH

TECHNICAL FIELD

The present invention relates to an AC switch and an uninterruptible power supply and voltage sag compensator including the AC switch.

BACKGROUND ART

Some uninterruptible power supplies and voltage sag compensators include an AC switch for high-speed switching between electrical connection and disconnection between an AC power source and a load. As the AC switch, a thyristor switch is widely used that is constituted of a pair of thyristors connected in antiparallel (see, for example, Japanese Patent Laying-Open No. 58-21925 [PTL 1]).

In some circuits that use power semiconductor switching elements (hereinafter also simply referred to as "switching elements"), in order to minimize a temperature rise due to heat generation from the switching elements, a plurality of switching elements are electrically connected in parallel so that a current is shared by the plurality of switching elements. This can decrease a current per switching element, thus decreasing the amount of heat generation from each switching element. Such a construction can be applied to the above-described AC switch, in which case a plurality of thyristor switches are connected in parallel. This can minimize a temperature rise in each thyristor switch.

CITATION LIST

Patent Literature

PTL 1: Japanese Patent Laying-Open No. 58-21925

SUMMARY OF INVENTION

Technical Problem

However, in a parallel circuit of a plurality of switching elements, the variations in electrical characteristics between the switching elements would cause unequal sharing of current between the switching elements, thus causing the current to partially flow through only a part of the switching elements. As a result, an increase in current flowing through the parallel circuit may significantly increase the amount of heat generation from the part of the switching elements.

Examples of techniques for equalizing the current shares between a plurality of switching elements include: a technique using reactors connected in series to switching elements, and a technique using a plurality of switching elements having equal electrical characteristics to constitute a parallel circuit. However, the former technique, which requires reactors, involves increases in size and cost of the circuit. The latter technique, which requires additional steps of measuring the electrical characteristics of each switching element and selecting switching elements, involves complication of the manufacturing process.

If an AC switch has a parallel circuit of a plurality of thyristor switches, the application of current needs to be synchronized between the plurality of thyristor switches. In order to synchronize the application of current between the plurality of thyristor switches, a synchronization control circuit may be provided in a controller of the AC switch, for example. This synchronization control circuit may be used to synchronize the gate signal for application to each thyristor switch with an AC power source. However, the inclusion of the synchronization control circuit may complicate the circuit configuration, thus increasing the size and cost of the device.

The present invention has been made to solve such problems. An object of the present invention is to provide an AC switch that can minimize a temperature rise in each switching element with a simple configuration, and to provide an uninterruptible power supply and voltage sag compensator including such an AC switch.

Solution to Problem

An AC switch according to the present disclosure is an AC switch that switches between electrical connection and disconnection between an AC power source and a load. The AC switch includes a first thyristor, a second thyristor, a third thyristor, and a fourth thyristor. The first thyristor has an anode connected to the AC power source, and a cathode connected to the load. The second thyristor is connected in antiparallel to the first thyristor. The third thyristor has an anode connected to the AC power source, and a cathode connected to the load. The fourth thyristor is connected in antiparallel to the third thyristor. The AC switch further includes a current detector and a controller. The current detector detects the AC current supplied from the AC power source to the load. The controller controls the conduction and non-conduction of the first to fourth thyristors. The controller causes the first thyristor and the third thyristor to conduct alternately and causes the second thyristor and the fourth thyristor to conduct alternately, for each one-cycle period of the AC current, in accordance with the detection value from the current detector.

Advantageous Effects of Invention

The present disclosure provides an AC switch that can minimize a temperature rise in each thyristor with a simple configuration, and provides an uninterruptible power supply and voltage sag compensator including such an AC switch.

DESCRIPTION OF EMBODIMENTS

Embodiments of the present invention will now be described in detail with reference to the drawings. In the following, identical or corresponding parts are denoted by identical reference signs, and the redundant description is not repeated in principle.

Embodiment 1

Figure 1:
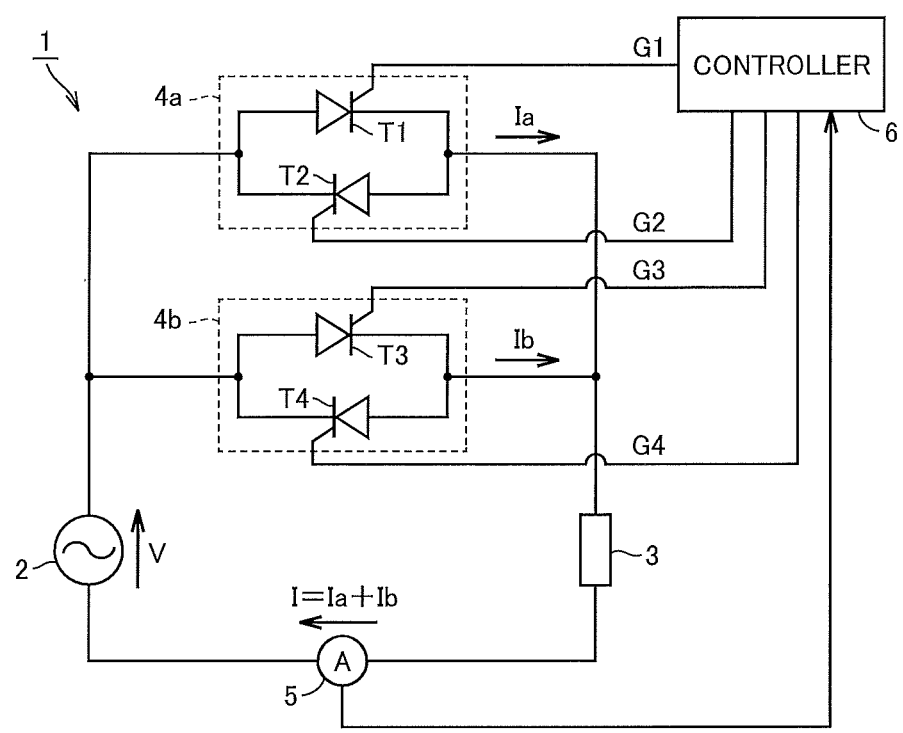
FIG. 1 is a schematic configuration diagram of an AC switch in embodiment 1.

FIG. 1 is a schematic configuration diagram of an AC switch in embodiment 1 of the present invention.

With reference to FIG. 1, an AC switch 1 in embodiment 1 of the present invention is connected between an AC power source 2 and a load 3, so that AC switch 1 switches between electrical connection and disconnection between AC power source 2 and load 3. For simplicity of the drawing and the explanation, FIG. 1 and other drawings described hereinafter representatively show a circuit for only a single phase. Note that, however, AC power source 2 may be a single-phase AC power source or may be a three-phase AC power source.

AC power source 2 may be a commercial power source or may be an independent power source unit. Load 3 operates on AC power supplied from AC power source 2 via AC switch 1. Load 3 may be a resistive load or may be an inductive load. In FIG. 1, V denotes the power source voltage of AC power source 2, and I denotes the AC current supplied to load 3 via AC switch 1 (hereinafter referred to as a "load current").

AC switch 1 includes a first thyristor T1, a second thyristor T2, a third thyristor T3, and a fourth thyristor T4. AC switch 1 also includes a current detector 5 and a controller 6.

First thyristor T1 has an anode connected to AC power source 2, and a cathode connected to load 3. Second thyristor T2 is connected in antiparallel to first thyristor T1. Third thyristor T3 has an anode connected to AC power source 2, and a cathode connected to load 3. Fourth thyristor T4 is connected in antiparallel to third thyristor T3. Hereinafter each of thyristors T1 to T4 is also simply referred to as a "thyristor T" as a generic term.

Current detector 5 detects load current I and outputs a signal indicating the detection value to controller 6.

Controller 6 controls the conduction and non-conduction of thyristors T1 to T4 in accordance with the detection value from current detector 5. Controller 6 is implemented mainly by, for example, a central processing unit (CPU), a memory, and an interface circuit. Controller 6 generates a gate signal G to be applied to each thyristor T, in response to an opening-closing instruction provided from a host control unit (not shown).

First thyristor T1 is applied with a gate signal G1 by controller 6. With gate signal G1 applied, first thyristor T1 is conducting during the positive half-cycle periods in the sine waveform of load current I.

Second thyristor T2 is applied with a gate signal G2 by controller 6. With gate signal G2 applied, second thyristor T2 is conducting during the negative half-cycle periods in the sine waveform of load current I.

Third thyristor T3 is applied with a gate signal G3 by controller 6. With gate signal G3 applied, third thyristor T3 is conducting during the positive half-cycle periods in the sine waveform of load current I.

Fourth thyristor T4 is applied with a gate signal G4 by controller 6. With gate signal G4 applied, fourth thyristor T4 is conducting during the negative half-cycle periods in the sine waveform of load current I.

That is, with gate signal G applied to all thyristors T, thyristors T1 and T3 are conducting during the positive half-cycle periods of load current I, and thyristors T2 and T4 are conducting during the negative half-cycle periods of load current I.

As shown in FIG. 1, first thyristor T1 and second thyristor T2 connected in antiparallel constitute a first thyristor switch 4a. Third thyristor T3 and fourth thyristor T4 connected in antiparallel constitute a second thyristor switch 4b. First thyristor switch 4a and second thyristor switch 4b are connected in parallel between AC power source 2 and load 3. Accordingly, when first thyristor switch 4a and second thyristor switch 4b are both conducting, load current I is shared by first thyristor switch 4a and second thyristor switch 4b. In FIG. 1, Ia denotes the share current of first thyristor switch 4a, and Ib denotes the share current of second thyristor switch 4b.

If first thyristor switch 4a and second thyristor switch 4b are the same in internal impedance of thyristors T, load current I is equally shared by first thyristor switch 4a and second thyristor switch 4b (Ia=Ib). In this case, therefore, the current flowing through each thyristor switch is reduced by half, compared to an AC switch constituted of a single thyristor switch. The amount of heat generation from each thyristor switch is proportional to the product of the square of current flowing through thyristors T, the internal impedance of thyristors T, and the current-carrying time. Therefore, the reduction in current flowing through the thyristor switch can reduce the amount of heat generation from the thyristor switch.

However, if first thyristor switch 4a and second thyristor switch 4b are different in electrical characteristics of thyristors T and thus different in internal impedance, load current I flows intensively through one of the thyristor switches that has a lower internal impedance. Such unequal sharing of load current I causes an increase in the amount of heat generation from the one thyristor switch, thus reducing the advantage of connecting two thyristor switches in parallel. In particular, an increase in load current I causes a significant increase in the amount of heat generation from the one thyristor switch.

As described hereinafter, AC switch 1 in embodiment 1 controls the conduction and non-conduction of each of thyristors T1 to T4, thereby equalizing the shares of load current I with a simple configuration.

Figure 2:
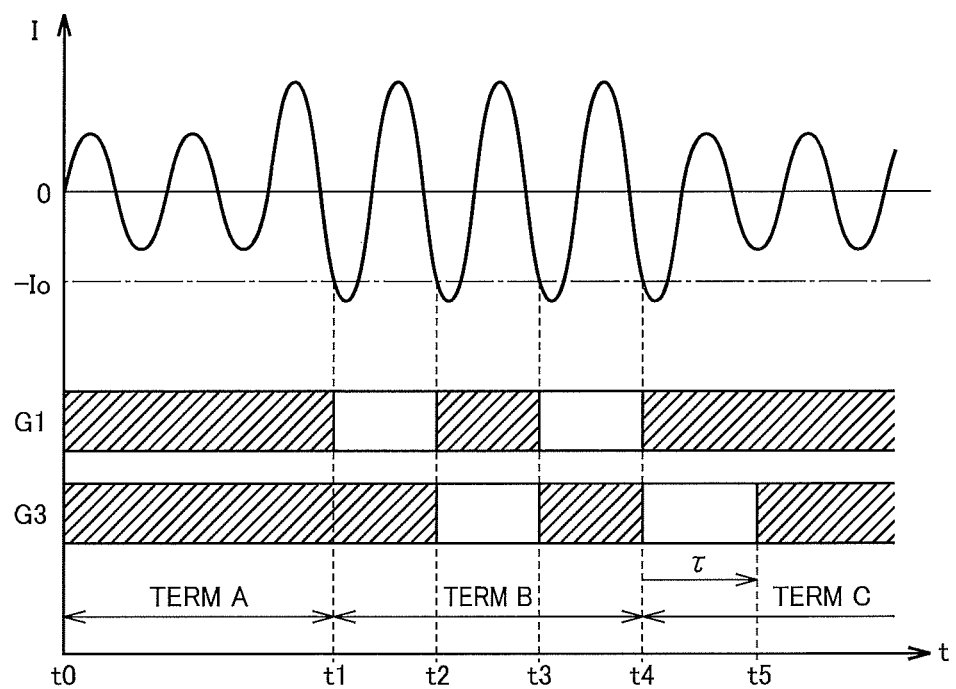
FIG. 2 is a diagram for illustrating the relation between a load current and gate signals applied to first and third thyristors.

First, with reference to FIG. 2, the control of thyristors T1 and T3 performed by controller 6 is described.

FIG. 2 is a diagram for illustrating the relation between load current I and gate signals G1 and G3 respectively applied to first and third thyristors T1 and T3. In FIG. 2, for each of gate signals G1, G3, the terms indicated by a shade represent the terms for which the gate signal is applied to the thyristor, and the terms indicated by white represent the terms for which no gate signal is applied to the thyristor.

Controller 6 applies gate signals G1, G3 in accordance with load current I detected by current detector 5. Specifically, when load current I has a minimum value higher than negative threshold value "−Io" (Io>0), controller 6 applies gate signal G1 and gate signal G3 simultaneously. In FIG. 2, during term A from time t0 to t1, gate signal G1 and gate signal G3 are both applied. In this term A, thyristors T1 and T3 are both conducting during the positive half-cycle periods of load current I. Accordingly, during the positive half-cycle periods, load current I is shared by first thyristor T1 and third thyristor T3.

At this time, first thyristor T1 and third thyristor T3, if unequal in electrical characteristics, will unequally share load current I, resulting in inequality between current Ia and current Ib. However, even if most of load current I flows through one of the thyristors T, the amount of heat generation from this thyristor will not become a problem since load current I itself is low enough. In other words, negative threshold value "−Io" is set such that, even if all the load current I flows through one of the thyristors T, the amount of heat generation from this thyristor will not become a problem.

At time t1, load current I decreases to below negative threshold value "−Io". Then, controller 6 alternately applies gate signal G1 and gate signal G3 every time load current I decreases to below negative threshold value "−Io". This corresponds to alternately interrupting gate signal G1 and gate signal G3 every time load current I decreases to below negative threshold value "−Io".

In FIG. 2, at time t1, gate signal G1 is interrupted and only gate signal G3 is applied. Accordingly, during the positive half-cycle period immediately after time t1, only third thyristor T3 is conducting so that all the load current I flows through third thyristor T3 (I=Ib).

Subsequently, at time t2, load current I decreases to below negative threshold value "−Io" again. Then, gate signal G3 is interrupted and only gate signal G1 is applied. Accordingly, during the positive half-cycle period immediately after time t2, only first thyristor T1 is conducting so that all the load current I flows through first thyristor T1 (I=Ia).

Further, at time t3, load current I decreases to below negative threshold value "−Io". Then, gate signal G1 is interrupted and only gate signal G3 is applied. Accordingly, during the positive half-cycle period immediately after time t3, only third thyristor T3 is conducting so that all the load current I flows through third thyristor T3 (I=Ib).

As a result, as shown in FIG. 2, during term B from time t1 to t4, first thyristor T1 and third thyristor T3 alternately conduct for each one-cycle period of load current I. Accordingly, the current-carrying time per thyristor T is reduced by about half, compared to thyristors T1 and T3 both conducting. The reduction in current-carrying time for each thyristor T allows the reduction in the amount of heat generation from each thyristor T.

At time t4, load current I decreases to below negative threshold value "−Io" again. Then, gate signal G3 is interrupted and only gate signal G1 is applied. In FIG. 2, after time t4, the magnitude (absolute value) of load current I decreases. If load current I does not decrease to below negative threshold value "−Io" again during the time period from when load current I decreased to below negative threshold value "−Io" to when prescribed time period τ has elapsed, controller 6 applies gate signals G1 and G3 simultaneously. In FIG. 2, at time t5 after a lapse of prescribed time period τ (first time period) from time t4, gate signal G3 is applied in addition to gate signal G1. Accordingly, at and after time t5, thyristors T1 and T3 are both conducting during the positive half-cycle periods of load current I. Thus, during the positive half-cycle periods, load current I is shared by first thyristor T1 and third thyristor T3. Prescribed time period t1 is set to a time period longer than the one-cycle period of load current I.

Figure 3:
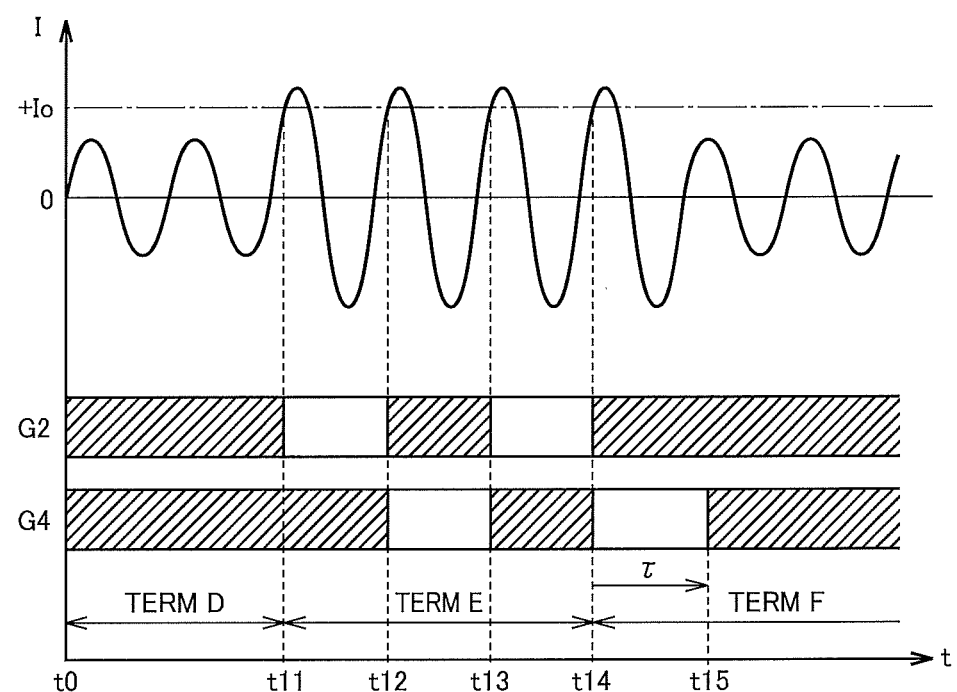
FIG. 3 is a diagram for illustrating the relation between a load current and gate signals applied to second and fourth thyristors.

Next, with reference to FIG. 3, the control of thyristors T2 and T4 performed by controller 6 is described.

FIG. 3 is a diagram for illustrating the relation between load current I and gate signals G2 and G4 respectively applied to second and fourth thyristors T2 and T4. In FIG. 3, for each of gate signals G2, G4, the terms indicated by a shade represent the terms for which the gate signal is applied to the thyristor, and the terms indicated by white represent the terms for which no gate signal is applied to the thyristor.

Controller 6 applies gate signals G2, G4 in accordance with load current I detected by current detector 5. Specifically, when load current I has a maximum value lower than positive threshold value "Io", controller 6 applies gate signals G2 and G4 simultaneously. In FIG. 3, during term D from time t0 to t11, gate signals G2 and G4 are both applied. In this term D, thyristors T2 and T4 are both conducting during the negative half-cycle periods of load current I. Accordingly, during the negative half-cycle periods, load current I is shared by second thyristor T2 and fourth thyristor T4.

At this time, second thyristor T2 and fourth thyristor T4, if unequal in electrical characteristics, will unequally share load current I, resulting in inequality between current Ia and current Ib. However, even if most of load current I flows through one of the thyristors T, the amount of heat generation from this thyristor will not become a problem since load current I itself is low enough. In other words, positive threshold value "Io" is set such that, even if all the load current I flows through one of the thyristors T, the amount of heat generation from this thyristor will not become a problem.

At time t11, load current I increases to above positive threshold value "Io". Then, controller 6 alternately applies gate signal G2 and gate signal G4 every time load current I increases to above positive threshold value "Io". This corresponds to alternately interrupting gate signal G2 and gate signal G4 every time load current I increases to above positive threshold value "Io".

In FIG. 3, at time t11, gate signal G2 is interrupted and only gate signal G4 is applied. Accordingly, during the negative half-cycle period immediately after time t11, only fourth thyristor T4 is conducting so that all the load current I flows through fourth thyristor T4 (I=Tb).

Subsequently, at time t12, load current I increases to above positive threshold value "Io" again. Then, gate signal G4 is interrupted and only gate signal G2 is applied. Accordingly, during the negative half-cycle period immediately after time t12, only second thyristor T2 is conducting so that all the load current I flows through second thyristor T2 (I=Ia).

Further, at time t13, load current I increases to above positive threshold value "Io". Then, gate signal G2 is interrupted and only gate signal G4 is applied. Accordingly, during the negative half-cycle period immediately after time t13, only fourth thyristor T4 is conducting so that all the load current I flows through fourth thyristor T4 (I=Tb).

As a result, as shown in FIG. 3, during term E from time t11 to t14, second thyristor T2 and fourth thyristor T4 alternately conduct for each one-cycle period of load current I. Accordingly, the current-carrying time per thyristor T is reduced by about half, compared to thyristors T2 and T4 both conducting. The reduction in current-carrying time for each thyristor T allows the reduction in the amount of heat generation from each thyristor T.

At time t14, load current I increases to above positive threshold value "Io" again. Then, gate signal G4 is interrupted and only gate signal G2 is applied. In FIG. 3, after time t14, the magnitude of load current I decreases. If load current I does not increase to above positive threshold value "Io" again during the time period from when load current I increased to above positive threshold value "Io" to when prescribed time period τ has elapsed, controller 6 applies gate signals G2 and G4 simultaneously. In FIG. 3, at time t15 after a lapse of prescribed time period τ from time t14, gate signal G4 is applied in addition to gate signal G2. Accordingly, at and after time t15, thyristors T2 and T4 are both conducting during the negative half-cycle periods of load current I. Thus, during the negative half-cycle periods, load current I is shared by second thyristor T2 and fourth thyristor T4.

Figure 4:
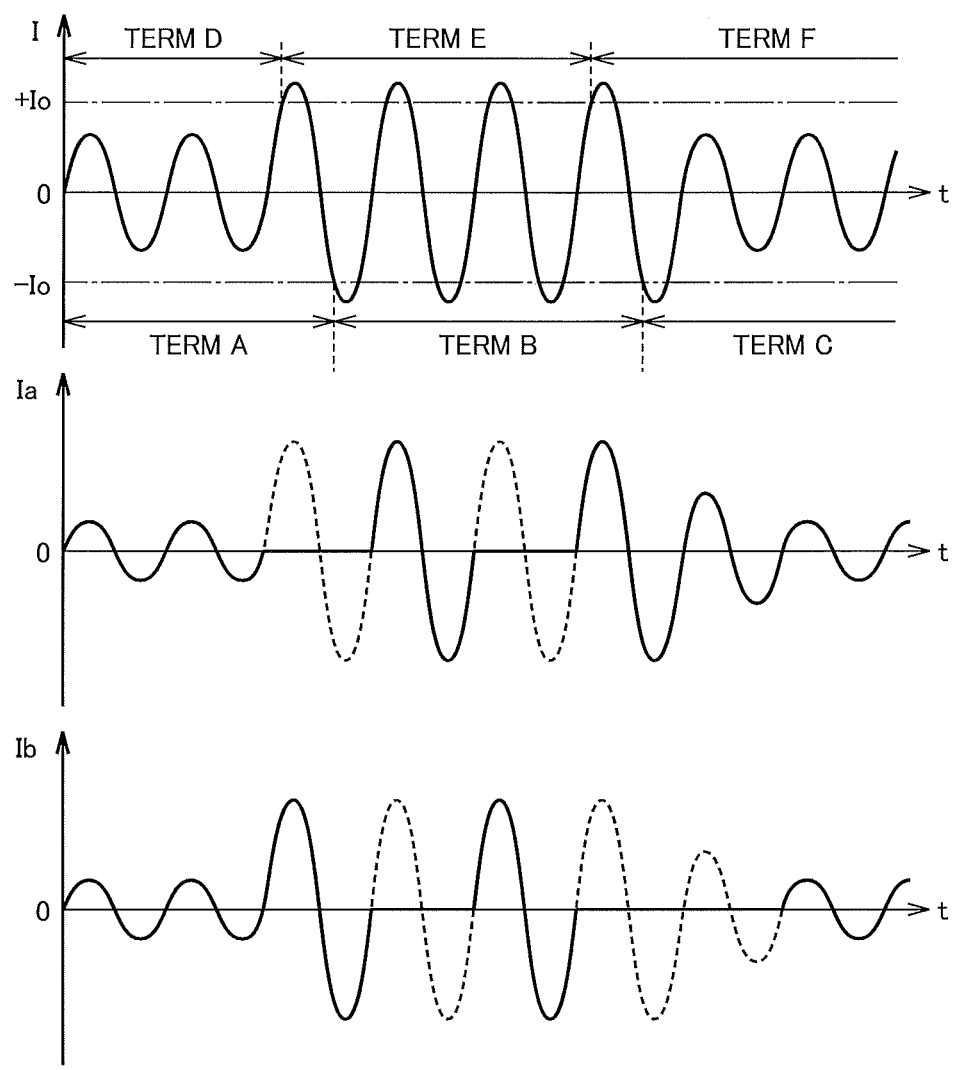
FIG. 4 is a diagram for illustrating currents caused to flow through the thyristor switches by the control of the thyristors shown in FIG. 2 and FIG. 3.

FIG. 4 is a diagram for illustrating currents caused to flow through thyristor switches 4a, 4b by the control of thyristors T1 to T4 shown in FIG. 2 and FIG. 3. FIG. 4 shows the waveform of load current I, and the waveforms of currents Ia and Ib respectively flowing through thyristor switches 4a and 4b.

As shown in FIG. 2 and FIG. 3, when load current I detected by current detector 5 has a minimum value higher than negative threshold value "−Io" and a maximum value lower than positive threshold value "Io", controller 6 applies gate signals G1 to G4. This situation corresponds to terms A and D in FIGS. 2 and 3, and terms C and F in FIGS. 2 and 3.

Controller 6 alternately applies gate signal G1 and gate signal G3 every time load current I decreases to below negative threshold value "−Io", and alternately applies gate signal G2 and gate signal G4 every time load current I increases to above positive threshold value "Io". This situation corresponds to term B in FIG. 2 and term E in FIG. 3.

Accordingly, when load current I has a peak value lower than threshold value Io, load current I is shared by first thyristor switch 4a and second thyristor switch 4b. On the other hand, when load current I has a peak value higher than threshold value Io, load current I flows alternately through first thyristor switch 4a and second thyristor switch 4b for each one-cycle period. Therefore, during the term when load current I has a peak value higher than threshold value Io, the current-carrying time for each thyristor switch is reduced to about half the term. In this term, therefore, although the current flowing through each thyristor switch is increased, the reduction in current-carrying time outweighs it and can reduce the amount of heat generation from each thyristor switch.

Figure 5:
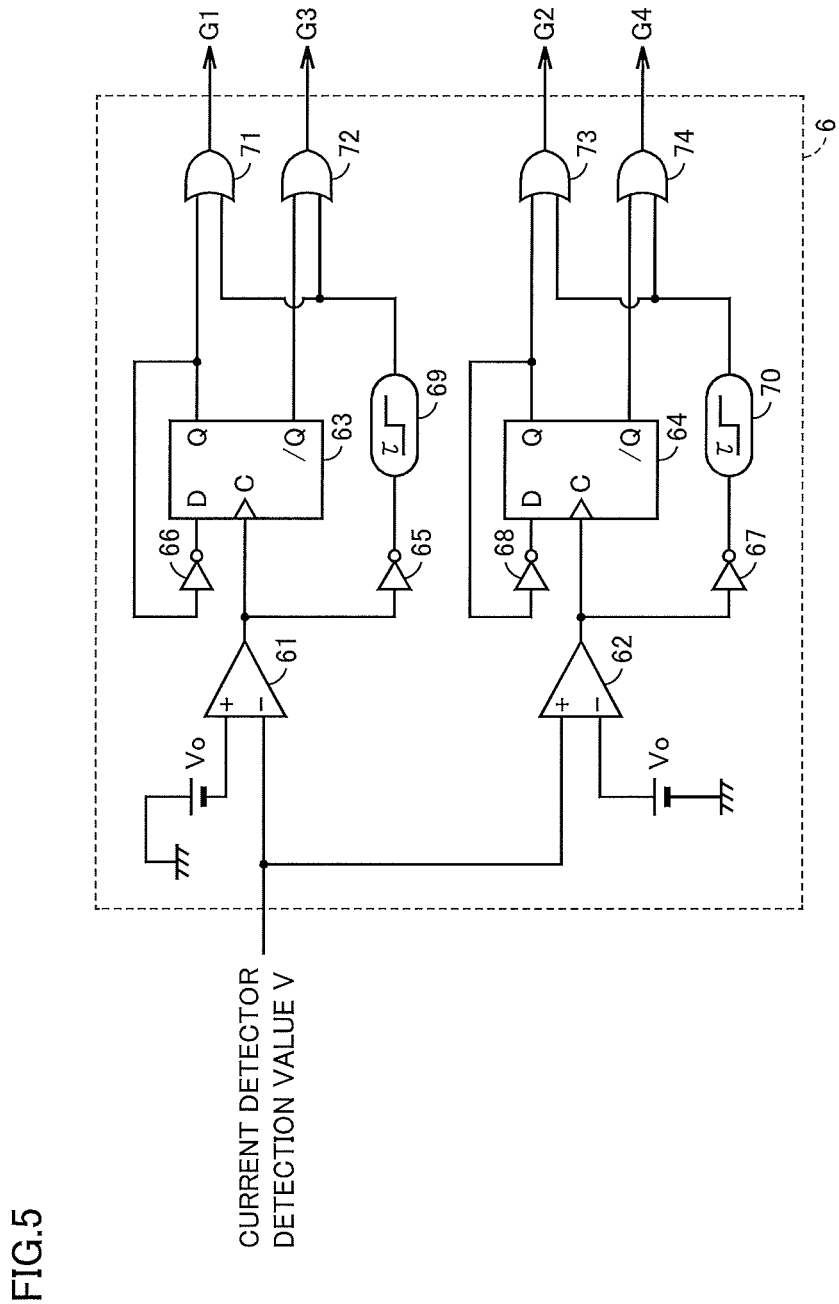
FIG. 5 is a block diagram showing a configuration of the controller shown in FIG. 1.

FIG. 5 is a block diagram showing a configuration of controller 6 shown in FIG. 1. With reference to FIG. 5, controller 6 includes comparators 61, 62, D flip-flops 63, 64, inverting devices 65 to 68, timers 69, 70, and logical sum (OR) circuits 71 to 74.

Comparator 61 has a non-inverting input terminal (+ terminal) to be applied with a threshold voltage "−Vo" associated with negative threshold value "−Io". Comparator 61 has an inverting input terminal (− terminal) to be applied with a signal indicating the detection value of load current I outputted from current detector 5 (corresponding to analog voltage V). Comparator 61 has an output terminal connected to clock input C of D flip-flop 63.

Comparator 61 compares voltage V with negative threshold voltage "−Vo" and outputs a signal indicating the comparison result. Specifically, when voltage V is lower than negative threshold voltage "−Vo", that is, when load current I is lower than negative threshold value "−Io", comparator 61 outputs an H (logical high) level signal. On the other hand, when voltage V is equal to or higher than negative threshold voltage "−Vo", that is, when load current I is equal to or higher than negative threshold value "−Io", comparator 61 outputs an L (logical low) level signal.

D flip-flop 63 operates with the output signal from comparator 61 serving as a clock. D flip-flop 63 has a control input D and a set output Q, between which inverting device 66 is connected.

D flip-flop 63 operates only when a clock is inputted, during which Q=D is satisfied. Set output Q and reset output /Q are complementary to each other. Set output Q does not change while a clock is being inputted. For example, when a clock is inputted while control input D is at L level, set output Q changes to L level and reset output /Q changes to H level. Further, control input D changes to H level. Until the next clock input, Q=L and /Q=H are maintained. When the next clock is inputted, control input D is at H level. Accordingly, in response to this clock, set output Q changes to H level, and reset output /Q changes to L level. Further, control input D changes to L level. When the next clock is further inputted, control input D is at L level. Accordingly, in response to this clock, set output Q changes to L level, and reset output /Q changes to H level.

Set output Q of D flip-flop 63 is inputted to OR circuit 71. Reset output /Q of D flip-flop 63 is inputted to OR circuit 72. OR circuits 71, 72 also receive the output signal from comparator 61 via inverting device 65 and timer 69. The output signal from comparator 61 is inverted by inverting device 65 to be inputted to timer 69.

Timer 69 inputs the output signal from inverting device 65 to OR circuits 71, 72. That is, the inversion signal of the output signal from comparator 61 is inputted to OR circuits 71, 72. Timer 69 measures the elapsed time period from when the output signal from inverting device 65 transitioned from H level to L level. If the output signal from inverting device 65 does not transition to H level again by the time the elapsed time period reaches prescribed time period τ, timer 69 forces the output signal to transition to H level when the elapsed time period has reached prescribed time period τ. On the other hand, if the output signal from inverting device 65 transitions to H level again by the time the elapsed time period reaches prescribed time period τ, timer 69 outputs the output signal from inverting device 65 straight. Prescribed time period τ set to a time period longer than the one-cycle period of load current I. Preferably prescribed time period τ is set to a time period longer than the one-cycle period of load current I and shorter than the double of the one-cycle period of load current I.

OR circuit 71 calculates the logical sum of set output Q of D flip-flop 63 and the output signal from timer 69, thereby generating gate signal G1. When set output Q is at H level or the output signal from timer 69 is at H level, gate signal G1 is generated to be applied to first thyristor T1.

OR circuit 72 calculates the logical sum of reset output /Q of D flip-flop 63 and the output signal from timer 69, thereby generating gate signal G3. When reset output /Q is at H level or the output signal from timer 69 is at H level, gate signal G3 is generated to be applied to third thyristor T3.

As described above, comparator 61, D flip-flop 63, inverting devices 65, 66, timer 69, and OR circuits 71, 72 constitute a generation circuit for generating gate signals G1, G3. In the generation circuit, every time voltage V becomes lower than negative threshold voltage "−Vo", D flip-flop 63 operates to generate gate signals G1, G3 complementary to each other. Thus, as described in FIG. 2 and FIG. 4, first thyristor T1 and third thyristor T3 alternately conduct for each positive half-cycle period of load current I.

By contrast, if voltage V does not become lower than negative threshold voltage "−Vo" again during the time period from when voltage V became lower than negative threshold voltage "−Vo" to when prescribed time period τ has elapsed, an H-level signal is inputted from timer 69 to OR circuits 71, 72. This causes H-level gate signals G1, G3 to be generated. Thus, as described in FIG. 2 and FIG. 4, during the positive half-cycle periods of load current I, first thyristor T1 and third thyristor T3 are both conducting.

In controller 6 shown in FIG. 5, comparator 62, D flip-flop 64, inverting devices 67, 68, timer 70, and OR circuits 73, 74 constitute a generation circuit for generating gate signals G2, G4. In the generation circuit, comparator 62 has an inverting input terminal (− terminal) to be applied with a threshold voltage "Vo" associated with positive threshold value "Io". Comparator 62 has a non-inverting input terminal (+ terminal) to be applied with a signal indicating the detection value of load current I outputted from current detector 5 (corresponding to analog voltage V). Comparator 62 has an output terminal connected to clock input C of D flip-flop 64.

Comparator 62 compares voltage V with positive threshold voltage "Vo" and outputs a signal indicating the comparison result. Specifically, when voltage V is higher than positive threshold voltage "Vo", that is, when load current I is higher than positive threshold value "Io", comparator 62 outputs an H-level signal. On the other hand, when voltage V is equal to or lower than positive threshold voltage "Vo", that is, when load current I is equal to or lower than positive threshold value "Io", comparator 62 outputs an L-level signal.

D flip-flop 64 operates with the output signal from comparator 62 serving as a clock. D flip-flop 64 has control input D and set output Q, between which inverting device 68 is connected.

D flip-flop 64 has the same configuration as D flip-flop 63. Set output Q of D flip-flop 64 is inputted to OR circuit 73. Reset output /Q of D flip-flop 64 is inputted to OR circuit 74. OR circuits 73, 74 also receive the output signal from comparator 62 via inverting device 67 and timer 70. The output signal from comparator 62 is inverted by inverting device 67 to be inputted to timer 70.

Timer 70 inputs the output signal from inverting device 67 to OR circuits 73, 74. That is, the inversion signal of the output signal from comparator 62 is inputted to OR circuits 73, 74. Timer 70 has the same configuration as timer 69. If the output signal from inverting device 67 does not transition to H level again by the time the elapsed time period from when the output signal from inverting device 67 transitioned from H level to L level reaches prescribed time period τ, timer 70 forces the output signal to transition to H level when the elapsed time period has reached prescribed time period τ. On the other hand, if the output signal from inverting device 67 transitions to H level again by the time the elapsed time period reaches prescribed time period τ, timer 70 outputs the output signal from inverting device 67 straight.

OR circuit 73 calculates the logical sum of set output Q of D flip-flop 64 and the output signal from timer 70, thereby generating gate signal G2. When set output Q is at H level or the output signal from timer 70 is at H level, gate signal G2 is generated to be applied to second thyristor T2.

OR circuit 74 calculates the logical sum of reset output /Q of D flip-flop 64 and the output signal from timer 70, thereby generating gate signal G4. When reset output /Q is at H level or the output signal from timer 70 is at H level, gate signal G4 is generated to be applied to fourth thyristor T4.

As described above, in the generation circuit for generating gate signals G2, G4, every time voltage V becomes higher than positive threshold voltage "Vo", D flip-flop 64 operates to generate gate signals G2, G4 complementary to each other. Thus, as described in FIG. 3 and FIG. 4, second thyristor T2 and fourth thyristor T4 alternately conduct for each negative half-cycle period of load current I.

By contrast, if voltage V does not become higher than positive threshold voltage "Vo" again during the time period from when voltage V became higher than positive threshold voltage "Vo" to when prescribed time period τ has elapsed, an H-level signal is inputted from timer 70 to OR circuits 73, 74. This causes H-level gate signals G2, G4 to be generated. Thus, as described in FIG. 3 and FIG. 4, during the negative half-cycle periods of load current I, second thyristor T2 and fourth thyristor T4 are both conducting.

As described above, according to AC switch 1 in embodiment 1 of the present invention, when load current I has a peak value higher than threshold value Io, load current I flows alternately through first thyristor switch 4a and second thyristor switch 4b for each one-cycle period. Therefore, during the term when load current I has a peak value higher than threshold value Io, the current-carrying time for each thyristor switch is reduced to about half the term. In this term, therefore, although the current flowing through each thyristor switch is increased, the reduction in current-carrying time outweighs it and can reduce the amount of heat generation from each thyristor switch, with a simple configuration.

Embodiment 2

Embodiment 1 describes a configuration in which, when load current I has a peak value higher than threshold value Io, load current I flows alternately through first thyristor switch 4a and second thyristor switch 4b for each one-cycle period. However, such a configuration may be employed regardless of the level of the peak value of load current I.

Embodiment 2 describes a configuration in which, in all terms, load current I flows alternately through first thyristor switch 4a and second thyristor switch 4b for each one-cycle period. AC switch 1 in embodiment 2 has the same circuit configuration as that in FIG. 1, except for the configuration of controller 6. Therefore, the redundant description is not repeated in detail.

Figure 6:
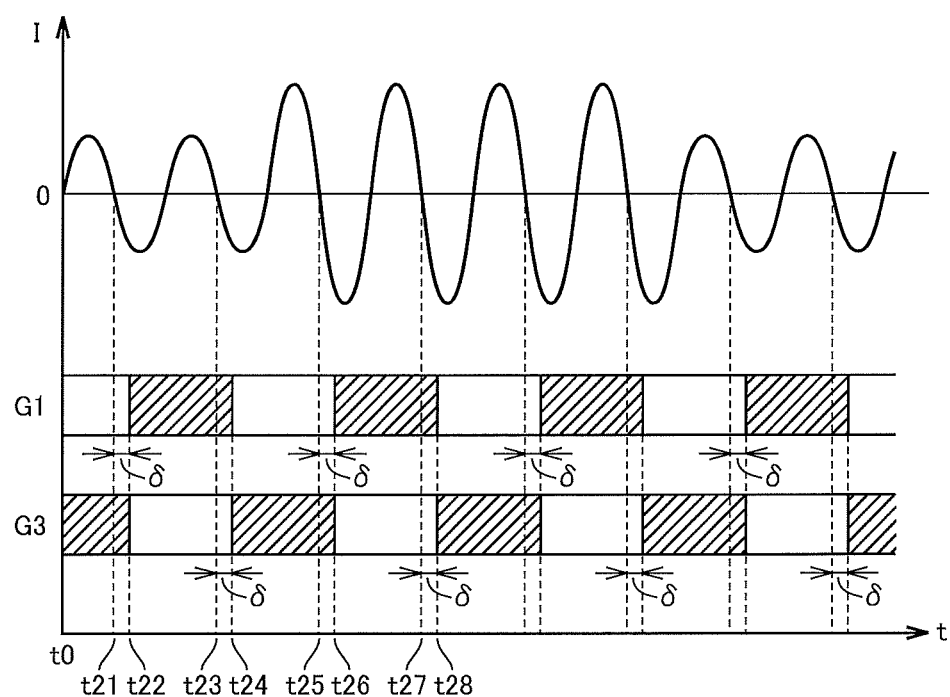
FIG. 6 is a diagram for illustrating the relation between a load current and gate signals applied to first and third thyristors.

First, with reference to FIG. 6, the control of thyristors T1 and T3 performed by controller 6 is described.

FIG. 6 is a diagram for illustrating the relation between load current I and gate signals G1 and G3 respectively applied to first and third thyristors T1 and T3. In FIG. 6, for each of gate signals G1, G3, the terms indicated by a shade represent the terms for which the gate signal is applied to the thyristor, and the terms indicated by white represent the terms for which no gate signal is applied to the thyristor.

Controller 6 applies gate signals G1, G3 in accordance with load current I detected by current detector 5. Specifically, controller 6 alternately applies gate signal G1 and gate signal G3 every time prescribed time period δ has elapsed from load current I switching its polarity from positive to negative.

In FIG. 6, at time t21, load current I is switched in polarity from positive to negative. Then, at time t22 after a lapse of prescribed time period δ (second time period) from time t21, gate signal G3 is interrupted and gate signal G1 is applied. Accordingly, during the positive half-cycle period of load current I immediately after time t22, only first thyristor T1 is conducting so that all the load current I flows through first thyristor T1 (I=Ia).

Subsequently, at time t23, load current I is switched in polarity from positive to negative again. Then, at time t24 after a lapse of prescribed time period δ from time t23, gate signal G1 is interrupted and gate signal G3 is applied. Accordingly, during the positive half-cycle period immediately after time t24, only third thyristor T3 is conducting so that all the load current I flows through third thyristor T3 (I=Ib). Prescribed time period δ is set to a period of time shorter than the half-cycle period of load current I.

Further, at time t25, load current I is switched in polarity from positive to negative. Then, at time t26 after a lapse of prescribed time period δ from time t25, gate signal G3 is interrupted and gate signal G1 is applied. Accordingly, during the positive half-cycle period immediately after time t26, only first thyristor T1 is conducting so that all the load current I flows through first thyristor T1 (I=Ia).

As a result, as shown in FIG. 6, first thyristor T1 and third thyristor T3 alternately conduct for each one-cycle period of load current I. Accordingly, the current-carrying time per thyristor T is reduced by about half, compared to thyristors T1 and T3 both conducting. The reduction in current-carrying time for each thyristor T allows the reduction in the amount of heat generation from each thyristor T.

Figure 7:
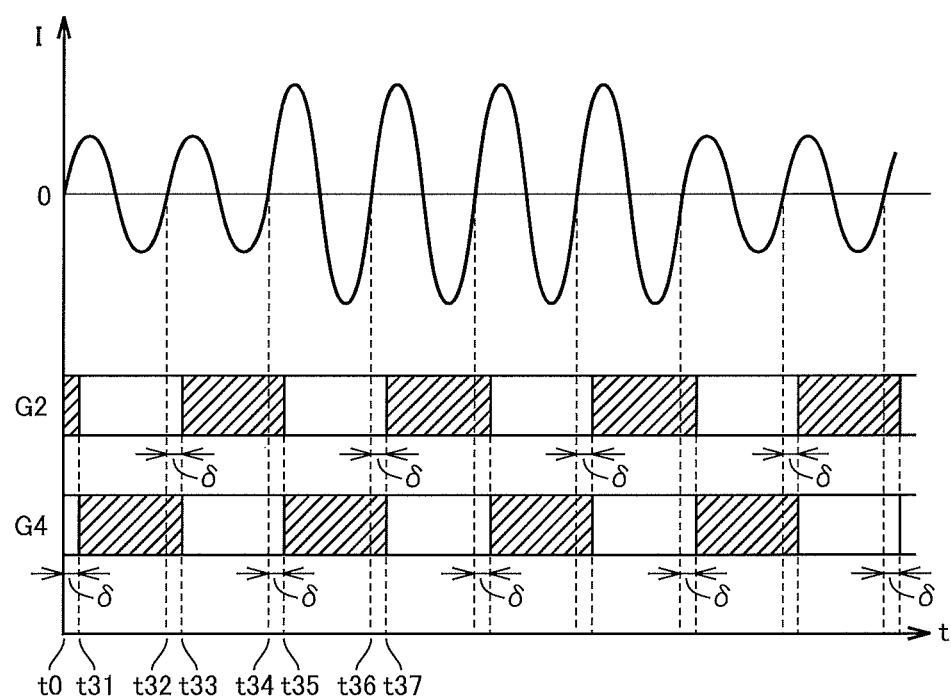
FIG. 7 is a diagram for illustrating the relation between a load current and gate signals applied to second and fourth thyristors.

Next, with reference to FIG. 7, the control of thyristors T2 and T4 performed by controller 6 is described.

FIG. 7 is a diagram for illustrating the relation between load current I and gate signals G2 and G4 respectively applied to second and fourth thyristors T2 and T4. In FIG. 7, for each of gate signals G2, G4, the terms indicated by a shade represent the terms for which the gate signal is applied to the thyristor, and the terms indicated by white represent the terms for which no gate signal is applied to the thyristor.

Controller 6 applies gate signals G2, G4 in accordance with load current I detected by current detector 5. Specifically, controller 6 alternately applies gate signal G2 and gate signal G4 every time prescribed time period δ has elapsed from load current I switching its polarity from negative to positive.

In FIG. 7, at time t32, load current I is switched in polarity from negative to positive. Then, at time t33 after a lapse of prescribed time period δ (second time period) from time t32, gate signal G4 is interrupted and gate signal G2 is applied. Accordingly, during the negative half-cycle period of load current I immediately after time t33, only second thyristor T2 is conducting so that all the load current I flows through second thyristor T2 (I=Ia).

Subsequently, at time t34, load current I is switched in polarity from negative to positive again. Then, at time t35 after a lapse of prescribed time period δ from time t34, gate signal G2 is interrupted and gate signal G4 is applied. Accordingly, during the negative half-cycle period immediately after time t35, only fourth thyristor T4 is conducting so that all the load current I flows through fourth thyristor T4 (I=Ib).

Further, at time t36, load current I is switched in polarity from negative to positive. Then, at time t37 after a lapse of prescribed time period δ from time t36, gate signal G4 is interrupted and gate signal G2 is applied. Accordingly, during the negative half-cycle period immediately after time t37, only second thyristor T2 is conducting so that all the load current I flows through second thyristor T2 (I=Ia).

As a result, as shown in FIG. 7, second thyristor T2 and fourth thyristor T4 alternately conduct for each one-cycle period of load current I. Accordingly, the current-carrying time per thyristor T is reduced by about half, compared to thyristors T2 and T4 both conducting. The reduction in current-carrying time for each thyristor T allows the reduction in the amount of heat generation from each thyristor T.

Figure 8:
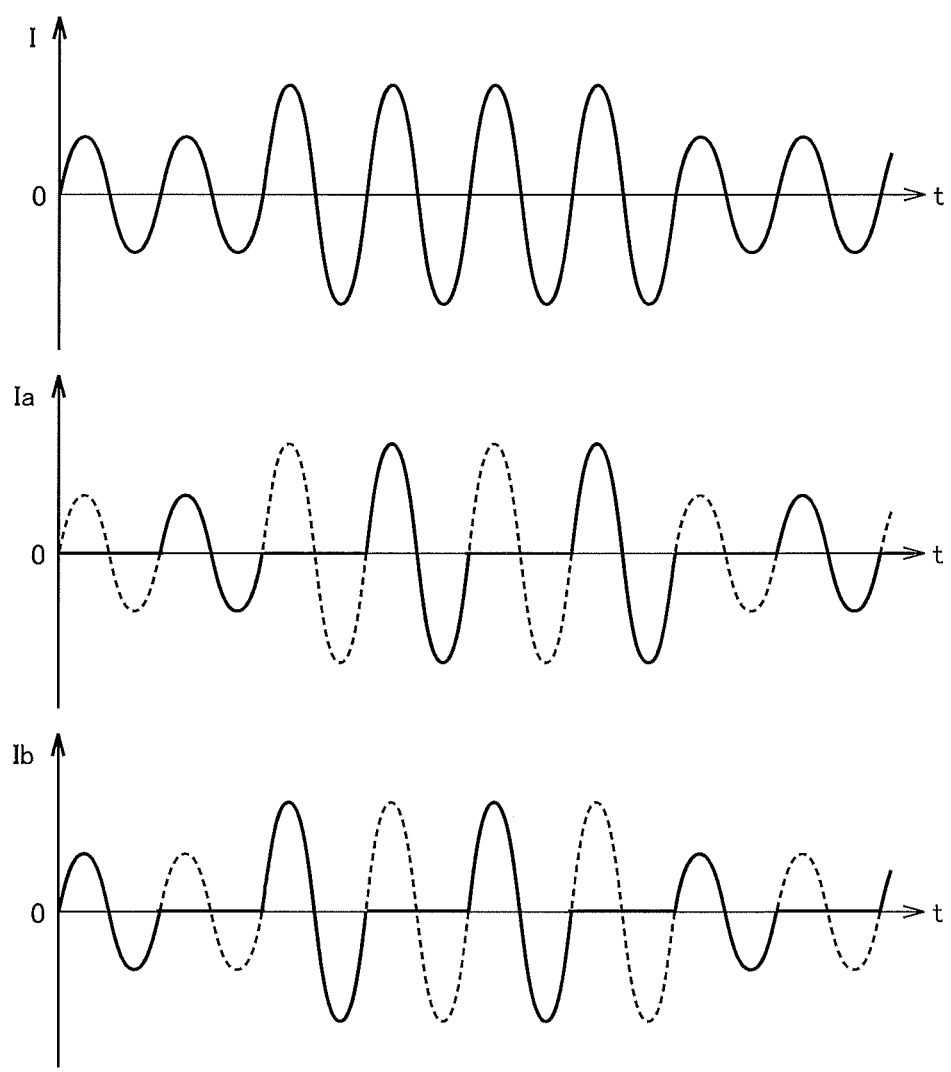
FIG. 8 is a diagram for illustrating currents caused to flow through the thyristor switches by the control of the thyristors shown in FIG. 6 and FIG. 7.

FIG. 8 is a diagram for illustrating currents caused to flow through thyristor switches 4a, 4b by the control of thyristors T1 to T4 shown in FIG. 6 and FIG. 7. FIG. 8 shows the waveform of load current I, and the waveforms of currents Ia and Ib respectively flowing through thyristor switches 4a and 4b.

As shown in FIG. 6 and FIG. 7, controller 6 alternately applies gate signals G1 and G3 every time prescribed time period δ has elapsed from load current I detected by current detector 5 switching its polarity from positive to negative. Also, controller 6 alternately applies gate signals G2 and G4 every time prescribed time period δ has elapsed from load current I switching its polarity from negative to positive.

Accordingly, load current I flows alternately through first thyristor switch 4a and second thyristor switch 4b for each one-cycle period. Therefore, the current-carrying time for each thyristor switch is reduced to about half the term. The reduction in current-carrying time for each thyristor switch allows the reduction in the amount of heat generation from each thyristor.

Figure 9:
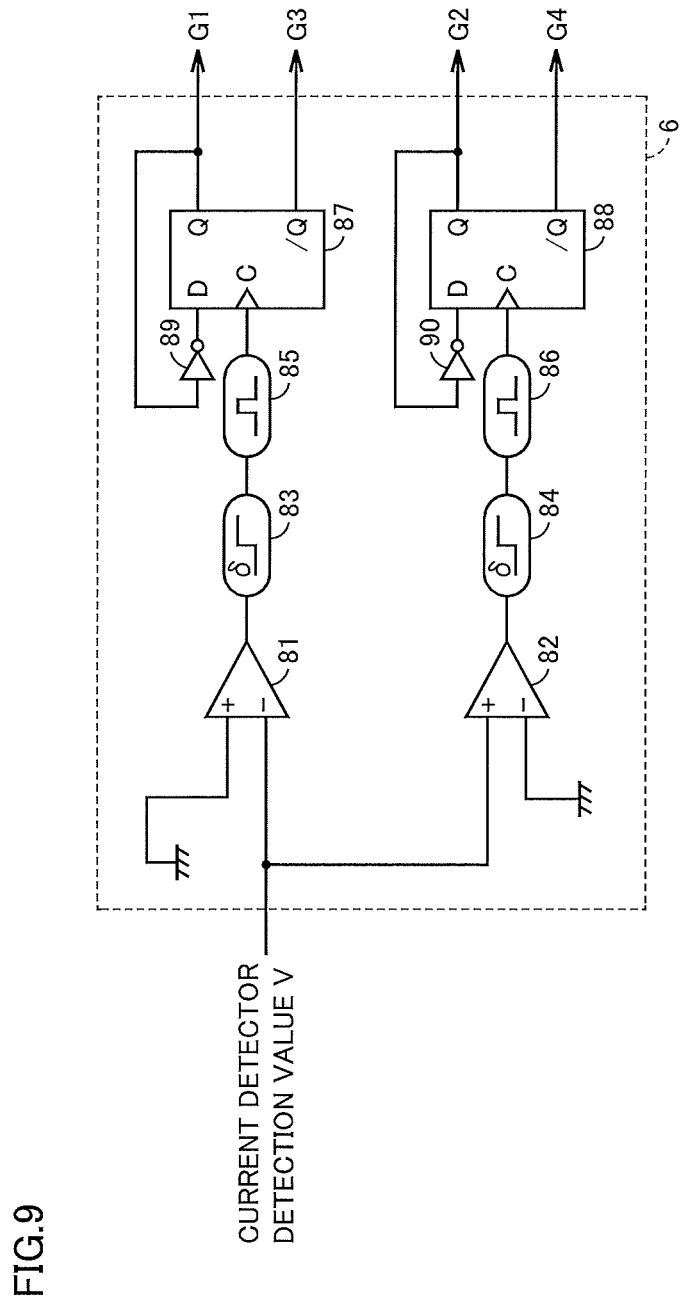
FIG. 9 is a block diagram showing a configuration of a controller in an AC switch in embodiment 2.

FIG. 9 is a block diagram showing a configuration of controller 6 in AC switch 1 in embodiment 2. With reference to FIG. 9, controller 6 includes comparators 81, 82, timers 83, 84, one-shot pulse generators 85, 86, D flip-flops 87, 88, and inverting devices 89, 90.

Comparator 81 has a non-inverting input terminal (+ terminal) to be applied with a ground voltage (0V). Comparator 81 has an inverting input terminal (− terminal) to be applied with a signal indicating the detection value of load current I outputted from current detector 5 (corresponding to analog voltage V). Comparator 81 has an output terminal connected to timer 83.

Comparator 81 compares voltage V with the ground voltage and outputs a signal indicating the comparison result. Specifically, when voltage V is lower than the ground voltage, that is, when load current I is lower than zero, comparator 81 outputs an H-level signal. On the other hand, when voltage V is equal to or higher than the ground voltage, that is, when load current I is equal to or higher than zero, comparator 81 outputs an L-level signal.

Timer 83 inputs the output signal from comparator 81 to one-shot pulse generator 85. Specifically, timer 83 measures the elapsed time period from when the output signal from comparator 81 transitioned from L level to H level. If the output signal from comparator 81 is kept at H level until the elapsed time period reaches prescribed time period δ, timer 83 inputs an H-level output signal to one-shot pulse generator 85. On the other hand, if the output signal from comparator 81 is at L level, or if the output signal from comparator 81 transitions to L level within prescribed time period δ from when the output signal from comparator 81 transitioned to H level, then timer 83 inputs an L-level output signal to one-shot pulse generator 85.

Upon receiving an H-level signal from timer 83, one-shot pulse generator 85 generates a one-shot pulse signal having a prescribed pulse width.

D flip-flop 87 operates with the pulse signal generated by one-shot pulse generator 85 serving as a clock. D flip-flop 87 has control input D and set output Q, between which inverting device 89 is connected.

D flip-flop 87 operates only when a clock is inputted, during which Q=D is satisfied. Set output Q and reset output /Q are complementary to each other. Set output Q does not change while a clock is being inputted. For example, when a clock is inputted while control input D is at L level, set output Q changes to L level and reset output /Q changes to H level. Further, control input D changes to H level. Until the next clock input, Q=L and /Q=H are maintained. When the next clock is inputted, control input D is at H level. Accordingly, in response to this clock, set output Q changes to H level, and reset output /Q changes to L level. Further, control input D changes to L level. When the next clock is further inputted, control input D is at L level. Accordingly, in response to this clock, set output Q changes to L level, and reset output /Q changes to H level.

D flip-flop 87 generates gate signal G1 based on set output Q, and generates gate signal G3 based on reset output /Q. Accordingly, when set output Q is at H level (reset output /Q is at L level), gate signal G1 is generated to be applied to first thyristor T1. When reset output /Q is at H level (set output Q is at L level), gate signal G3 is generated to be applied to third thyristor T3.

As described above, comparator 81, timer 83, one-shot pulse generator 85, D flip-flop 87, and inverting device 89 constitute a generation circuit for generating gate signals G1, G3. In the generation circuit, every time prescribed time period δ has elapsed from voltage V switching its polarity from positive to negative, D flip-flop 87 operates to generate gate signals G1, G3 complementary to each other. Thus, as described in FIG. 6 and FIG. 8, first thyristor T1 and third thyristor T3 alternately conduct for each positive half-cycle period of load current I.

In controller 6 shown in FIG. 9, comparator 82, timer 84, one-shot pulse generator 86, D flip-flop 88, and inverting device 90 constitute a generation circuit for generating gate signals G2, G4. In the generation circuit, comparator 82 has an inverting input terminal (− terminal) to be applied with a ground voltage (0V). Comparator 82 has a non-inverting input terminal (+ terminal) to be applied with a signal indicating the detection value of load current I outputted from current detector 5 (corresponding to analog voltage V). Comparator 82 has an output terminal connected to timer 84.

Comparator 82 compares voltage V with the ground voltage and outputs a signal indicating the comparison result. Specifically, when voltage V is higher than the ground voltage, that is, when load current I is higher than zero, comparator 82 outputs an H-level signal. On the other hand, when voltage V is equal to or lower than the ground voltage, that is, when load current I is equal to or lower than zero, comparator 82 outputs an L-level signal.

Timer 84 inputs the output signal from comparator 82 to one-shot pulse generator 86. Timer 84 has the same configuration as timer 83. If the output signal from comparator 82 is kept at H level until the elapsed time period from when the output signal from comparator 82 transitioned from L level to H level reaches prescribed time period δ, timer 84 inputs an H-level output signal to one-shot pulse generator 86. On the other hand, if the output signal from comparator 82 is at L level, or if the output signal from comparator 82 transitions to L level within prescribed time period δ from when the output signal from comparator 82 transitioned to H level, then timer 84 inputs an L-level output signal to one-shot pulse generator 86.

Upon receiving an H-level signal from timer 84, one-shot pulse generator 86 generates a one-shot pulse signal having a prescribed pulse width.

D flip-flop 88 operates with the pulse signal generated by one-shot pulse generator 86 serving as a clock. D flip-flop 88 has control input D and set output Q, between which inverting device 90 is connected.

D flip-flop 88 has the same configuration as D flip-flop 87. D flip-flop 88 generates gate signal G2 based on set output Q, and generates gate signal G4 based on reset output /Q. Accordingly, when set output Q is at H level (reset output /Q is at L level), gate signal G2 is generated to be applied to second thyristor T2. When reset output /Q is at H level (set output Q is at L level), gate signal G4 is generated to be applied to fourth thyristor T4.

As described above, in the generation circuit for generating gate signals G2, G4, every time prescribed time period δ has elapsed from voltage V switching its polarity from negative to positive, D flip-flop 88 operates to generate gate signals G2, G4 complementary to each other. Thus, as described in FIG. 7 and FIG. 8, second thyristor T2 and fourth thyristor T4 alternately conduct for each negative half-cycle period of load current I.

As described above, according to AC switch 1 in embodiment 2 of the present invention, load current I flows alternately through first thyristor switch 4a and second thyristor switch 4b for each one-cycle period. Therefore, the current-carrying time for each thyristor switch is reduced by about half, compared to thyristor switches 4a and 4b both carrying the current. Thus, with a simple configuration, the current-carrying time for each thyristor switch and therefore the amount of heat generation from each thyristor switch can be reduced.

Embodiment 3

In the following, embodiments 3 and 4 describe representative example devices to which AC switches 1 according to embodiments 1 and 2 are applicable.

Figure 10:
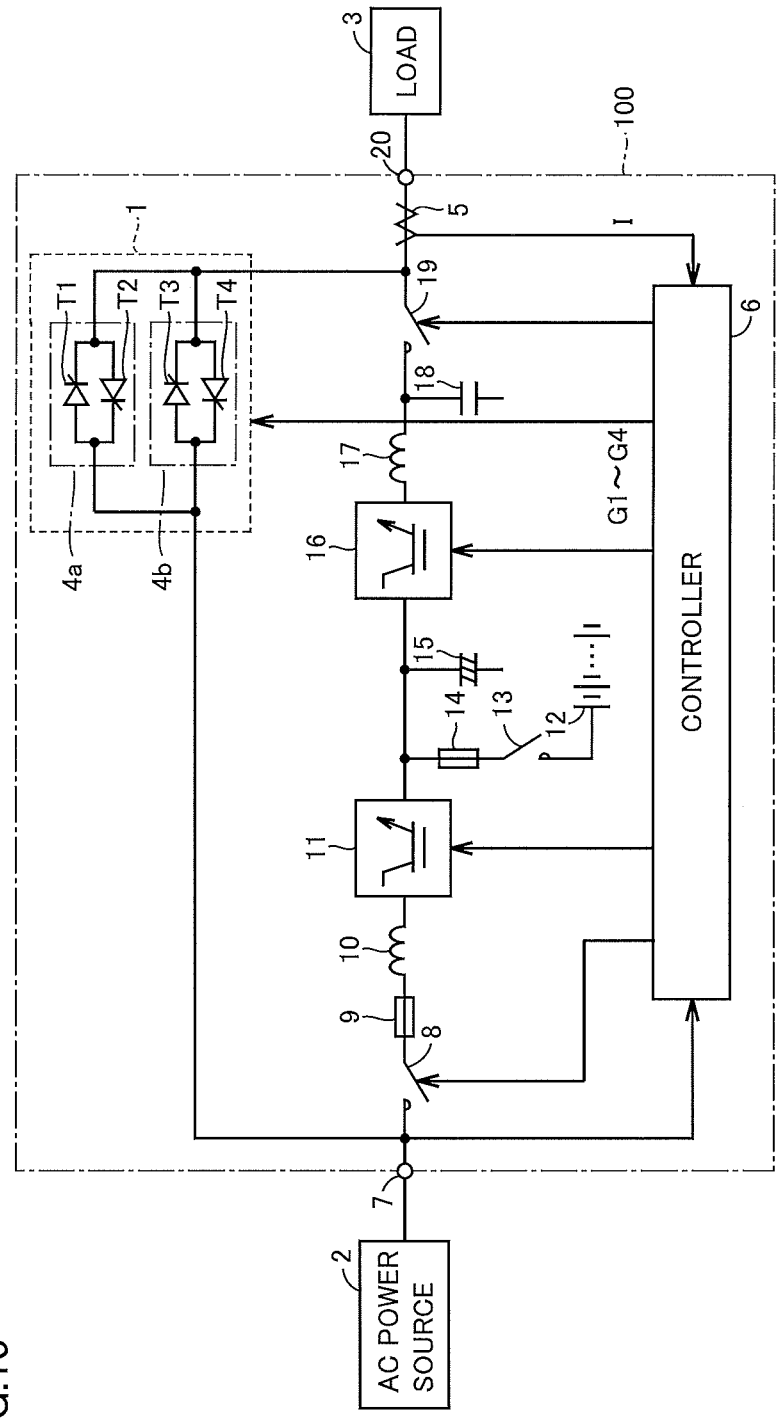
FIG. 10 is a general configuration diagram of an uninterruptible power supply in embodiment 3.

FIG. 10 is a general configuration diagram of an uninterruptible power supply in embodiment 3 of the present invention. With reference to FIG. 10, an uninterruptible power supply 100 in embodiment 3 is connected between AC power source 2 and load 3.

Uninterruptible power supply 100 includes an input terminal 7 and an output terminal 20. Input terminal 7 receives AC power from AC power source 2. Output terminal 20 is connected to load 3. Load 3 is driven by AC power supplied from uninterruptible power supply 100.

Uninterruptible power supply 100 further includes electromagnetic contactors (contactors) 8, 13, 19, a fuse 9, reactors 10, 17, a converter 11, an electrolytic capacitor 15, an inverter 16, a capacitor 18, an AC switch 1, a current detector 5, and a controller 6. Among these components, contactor 8, fuse 9, reactor 10, converter 11, inverter 16, reactor 17, and contactor 19 are connected in series between input terminal 7 and output terminal 20.

Contactor 8 is connected to the current-carrying path between input terminal 7 and converter 11. Contactor 8 is closed (ON) at the normal time during which AC power is normally supplied from AC power source 2, and is opened (OFF) at the time of, for example, maintenance of uninterruptible power supply 100. Fuse 9 is disposed on the current-carrying path between input terminal 7 and converter 11 so as to prevent a flow of overcurrent from AC power source 2. Reactor 10 allows passage of AC power from AC power source 2 and prevents propagation of switching frequency signals from converter 11 to AC power source 2.

Converter 11 and inverter 16 are constituted of semiconductor switching elements. Each semiconductor switching element may be, for example, an insulated gate bipolar transistor (IGBT). As a method for controlling the semiconductor switching elements, pulse width modulation (PWM) control may be used.

At the normal time, converter 11 converts AC power supplied from AC power source 2 into DC power. The DC power generated at converter 11 is supplied to inverter 16 and storage device 12. At the time of power failure during which the supply of AC power from AC power source 2 is stopped, the operation of converter 11 is stopped. The power conversion at converter 11 is controlled by controller 6.

Electrolytic capacitor 15 is connected to the AC output terminal of converter 11 and smooths the output voltage from converter 11. At the normal time, inverter 16 converts the DC power, smoothed by electrolytic capacitor 15, into AC power. At the time of power failure, inverter 16 converts the DC power from storage device 12 into AC power. The power conversion at inverter 16 is controlled by controller 6.

Storage device 12 is a power storage device for supplying DC power to inverter 16 at the time of power failure. At the normal time, storage device 12 stores DC power generated at converter 11. Fuse 14 and contactor 13 are connected in series between the DC input terminal of converter 11 and storage device 12. Contactor 13 is ON at the normal time, and is OFF at the time of, for example, maintenance of uninterruptible power supply 100 and storage device 12. Fuse 14 prevents a flow of overcurrent into converter 11 and storage device 12.

Reactor 17 and capacitor 18 constitute a filter for removing switching frequency components included in AC power outputted from inverter 16.

Contactor 19 (switch) is ON during a mode in which AC power is supplied from inverter 16 to load 3 (hereinafter also referred to as an "inverter feed mode"). On the other hand, contactor 19 is OFF during a mode in which AC power is supplied from AC power source 2 to load 3 through AC switch 1 (hereinafter also referred to as a "bypass feed mode"). The ON/OFF of contactor 19 is controlled by controller 6.

During the inverter feed mode, AC power supplied from AC power source 2 is converted into DC power by converter 11, and the DC power is then converted into AC power by inverter 16 to be supplied to load 3. Accordingly, the inverter feed mode can stably feed power to load 3. However, in the inverter feed mode, each of converter 11 and inverter 16 causes a power loss when converting power, thus making it difficult to achieve high efficiency of uninterruptible power supply 100.

By contrast, during the bypass feed mode, AC power supplied from AC power source 2 is suppled to load 3 through AC switch 1, that is, without passing through converter 11 and inverter 16. This eliminates the power losses at converter 11 and inverter 16, thus improving the operation efficiency of uninterruptible power supply 100. Converter 11 may be operated as needed during the bypass feed mode, so that DC power can be stored in storage device 12.

In uninterruptible power supply 100 in embodiment 3, converter 11, inverter 16, contactor 19, and storage device 12 constitute a "conversion device feed circuit". On the other hand, AC switch 1 constitutes a "bypass feed circuit".

AC switch 1 is connected between input terminal 7 and output terminal 20. Current detector 5 detects load current I and outputs a signal indicating the detection value to controller 6.

Controller 6 is configured to control the ON/OFF of contactor 19 and AC switch 1 and the power conversion at converter 11 and inverter 16, so that uninterruptible power supply 100 selectively performs the inverter feed mode and the bypass feed mode.

Specifically, when switching from the inverter feed mode to the bypass feed mode, controller 6 turns on AC switch 1 and turns off contactor 19. During the bypass feed mode, controller 6 controls the conduction and non-conduction of thyristors T1 to T4 constituting AC switch 1, in accordance with the detection value from current detector 5. At this time, controller 6 uses the control configuration described in FIG. 5 or FIG. 9 to generate gate signals G1 to G4 and apply the generated gate signals G1 to G4 to thyristors T1 to T4, respectively. When switching from the bypass feed mode to the inverter feed mode, controller 6 turns on contactor 19 and turns off all the thyristors T1 to T4.

According to uninterruptible power supply 100 in embodiment 3, during the bypass feed mode, load current I flows alternately through first thyristor switch 4a and second thyristor switch 4b for each one-cycle period, in accordance with the detection value of load current I. Therefore, the current-carrying time for each thyristor switch is reduced, compared to thyristor switches 4a and 4b both carrying load current I. Thus, with a simple configuration, the amount of heat generation from each thyristor switch can be reduced.

Embodiment 4

Figure 11:
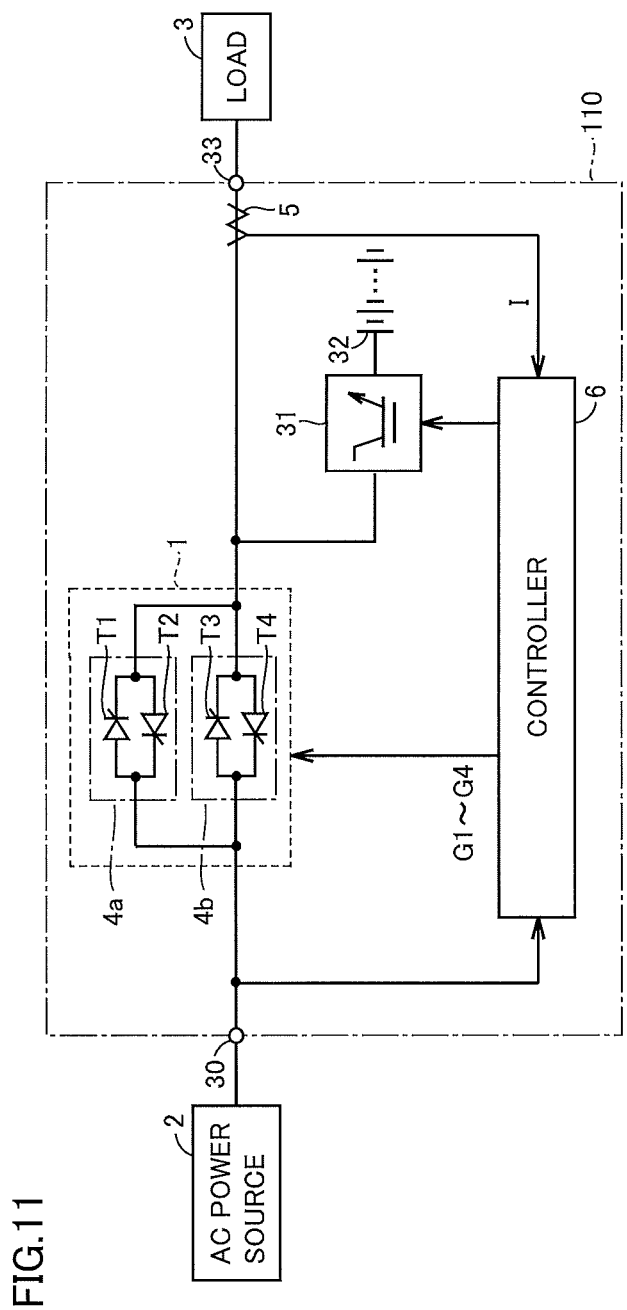
FIG. 11 is a general configuration diagram of a voltage sag compensator in embodiment 4.

FIG. 11 is a general configuration diagram of a voltage sag compensator in embodiment 4 of the present invention. With reference to FIG. 11, a voltage sag compensator 110 in embodiment 4 is connected between AC power source 2 and load 3. When an instantaneous voltage drop (voltage sag) or instantaneous power failure occurs in AC power source 2, voltage sag compensator 110 instantaneously separates load 3 from AC power source 2 and uninterruptedly supplies power to load 3. The voltage sag refers to a temporary voltage drop caused by a power-line accident by lightning or the like, which lasts until being removed by a power line protective relay.

Voltage sag compensator 110 includes an input terminal 30 and an output terminal 33. Input terminal 30 receives AC power from AC power source 2. Output terminal 33 is connected to load 3. Voltage sag compensator 110 further includes an AC switch 1, an inverter 31, a storage device 32, and a controller 6.

AC switch 1 is connected between input terminal 30 and output terminal 33. Current detector 5 detects load current I and outputs a signal indicating the detection value to controller 6.

Inverter 31 can perform an inversion operation and a rectification operation. In the rectification operation, inverter 31 converts AC power supplied from AC power source 2 into DC power and uses the DC power to charge storage device 32. When a voltage sag occurs, inverter 31 performs the inversion operation in which inverter 31 converts DC power stored in storage device 32 into AC power and supplies the AC power to load 3.

Controller 6 controls the power conversion at inverter 31 and controls the ON/OFF of AC switch 1. Specifically, at the normal time with no voltage sag, controller 6 controls the conduction and non-conduction of thyristors T1 to T4 constituting AC switch 1, in accordance with the detection value from current detector 5. Controller 6 uses the control configuration described in FIG. 5 or FIG. 9 to generate gate signals G1 to G4 and apply the generated gate signals G1 to G4 to thyristors T1 to T4, respectively. On the other hand, when a voltage sag occurs, controller 6 causes all the thyristors T1 to T4 to be non-conducting, and controls inverter 31 to perform the inversion operation.

According to voltage sag compensator 110 in embodiment 4, at the normal time with no voltage sag, load current I flows alternately through first thyristor switch 4a and second thyristor switch 4b for each one-cycle period, in accordance with the detection value of load current I. Therefore, the current-carrying time for each thyristor switch is reduced, compared to thyristor switches 4a and 4b both carrying load current I. Thus, with a simple configuration, the amount of heat generation from each thyristor switch can be reduced.

The embodiments disclosed herein should be considered illustrative in all respects, not limitative. It is intended that the scope of the present invention is defined not by the above description but by the terms of the claims, and that the scope of the present invention includes any modification in the meaning and scope equivalent to the terms of the claims.

REFERENCE SIGNS LIST

1: AC switch; 2: AC power source; 3: load; 4a: first thyristor switch; 4b: second thyristor switch; 5: current detector; 6: controller; 7, 30: input terminal; 8, 13, 19: contactor; 9, 14: fuse; 10, 17: reactor; 11: converter; 12, 32: storage device; 15: electrolytic capacitor; 16, 31: inverter; 18: capacitor; 20, 33: output terminal; 61, 62: comparator; 63, 64, 87, 88: D flip-flop; 65, 66, 67, 68, 89, 90: inverting device; 69, 70, 83, 84: timer; 71, 72, 73, 74: OR circuit; 85, 86: one-shot pulse generator; 100: uninterruptible power supply; 110: voltage sag compensator; T1: first thyristor; T2: second thyristor; T3: third thyristor; T4: fourth thyristor

The invention claimed is:

1. An AC switch that switches between electrical connection and disconnection between an AC power source and a load, the AC switch comprising:
    a first thyristor having an anode connected to the AC power source, and a cathode connected to the load;
    a second thyristor connected in antiparallel to the first thyristor;
    a third thyristor having an anode connected to the AC power source, and a cathode connected to the load;
    a fourth thyristor connected in antiparallel to the third thyristor;
    a current detector that detects an AC current supplied from the AC power source to the load; and
    a controller that controls conduction and non-conduction of the first to fourth thyristors, wherein
    the controller causes the first thyristor and the third thyristor to conduct alternately and causes the second thyristor and the fourth thyristor to conduct alternately, for each one-cycle period of the AC current, in accordance with a detection value from the current detector.

2. The AC switch according to claim 1, wherein
    the first to fourth thyristors are turned on and off in accordance with the AC current, with first to fourth gate signals being respectively applied to the first to fourth thyristors,
    when the detection value from the current detector has a minimum value higher than a negative threshold value and a maximum value lower than a positive threshold value, the controller applies the first and third gate signals simultaneously, and applies the second and fourth gate signals simultaneously, and
    when the detection value has a minimum value lower than the negative threshold value and a maximum value higher than the positive threshold value, the controller alternately applies the first gate signal and the third gate signal every time the detection value from the current detector decreases to below the negative threshold value, and alternately applies the second gate signal and the fourth gate signal every time the detection value from the current detector increases to above the positive threshold value.

3. The AC switch according to claim 2, wherein
    if the detection value from the current detector does not decrease to below the negative threshold value again during a time period from when the detection value decreases to below the negative threshold value to when a first time period longer than the one-cycle period of the AC current has elapsed, the controller applies the first gate signal and the third gate signal simultaneously, and
    if the detection value from the current detector does not increase to above the positive threshold value again during a time period from when the detection value increases to above the positive threshold value to when the first time period has elapsed, the controller applies the second gate signal and the fourth gate signal simultaneously.

4. The AC switch according to claim 1, wherein
    the first to fourth thyristors are turned on and off in accordance with the AC current, with first to fourth gate signals being respectively applied to the first to fourth thyristors,
    every time a second time period shorter than a half-cycle period of the AC current has elapsed from when the detection value from the current detector is switched in polarity from positive to negative, the controller alternately applies the first gate signal and the third gate signal, and
    every time the second time period has elapsed from when the detection value from the current detector is switched in polarity from negative to positive, the controller alternately applies the second gate signal and the fourth gate signal.

* * * * *